United States Patent [19]

dela Cruz

[11] 4,243,931

[45] Jan. 6, 1981

[54] CURRENT ISOLATOR

[75] Inventor: Moises A. dela Cruz, Cottage Grove, Minn.

[73] Assignee: Rosemount Inc., Minneapolis, Minn.

[21] Appl. No.: 24,868

[22] Filed: Mar. 28, 1979

[51] Int. Cl.³ .............................................. H01F 40/14
[52] U.S. Cl. ................................ 323/302; 324/117 R; 323/310
[58] Field of Search ..................... 323/6, 44 R, 48, 56; 324/55, 117 R

[56] References Cited

U.S. PATENT DOCUMENTS

| 3,500,171 | 3/1970 | Kusters et al. | 323/6 |
| 3,699,442 | 10/1972 | Riley | 324/117 R |
| 3,916,310 | 10/1975 | Stark et al. | 323/6 X |
| 4,027,235 | 5/1977 | Macrander et al. | 323/48 |
| 4,054,829 | 10/1977 | Searle | 323/6 |
| 4,064,449 | 12/1977 | Macrander | 323/6 X |
| 4,096,363 | 6/1978 | Earp | 323/6 X |
| 4,163,189 | 7/1979 | Smutny | 323/6 |

*Primary Examiner*—A. D. Pellinen

*Attorney, Agent, or Firm*—Kinney, Lange, Braddock, Westman and Fairbairn

[57] ABSTRACT

A current isolator circuit generates an electrically isolated output current which is related to an input current. The current isolator includes a magnetically saturable transformer having a core and first, second, and third windings. The input current flows through the first winding, and the output current flows through the second winding. The third winding is driven by a periodic drive signal, which alternately drives the transformer between first and second magnetically saturated states. When a change in the input current occurs, the magnetizing current in the third winding changes, thereby causing a change in the time required to drive the transformer from the first to the second magnetically saturated state, and an opposite change in the time required to drive the transformer from the second to the first magnetically saturated state. The difference in saturation times is sensed and is used in controlling the magnitude of the output current flowing through the second winding. As a result, the output current again attains its predetermined relationship to the input current, and the current isolator is returned to a balanced condition.

11 Claims, 1 Drawing Figure

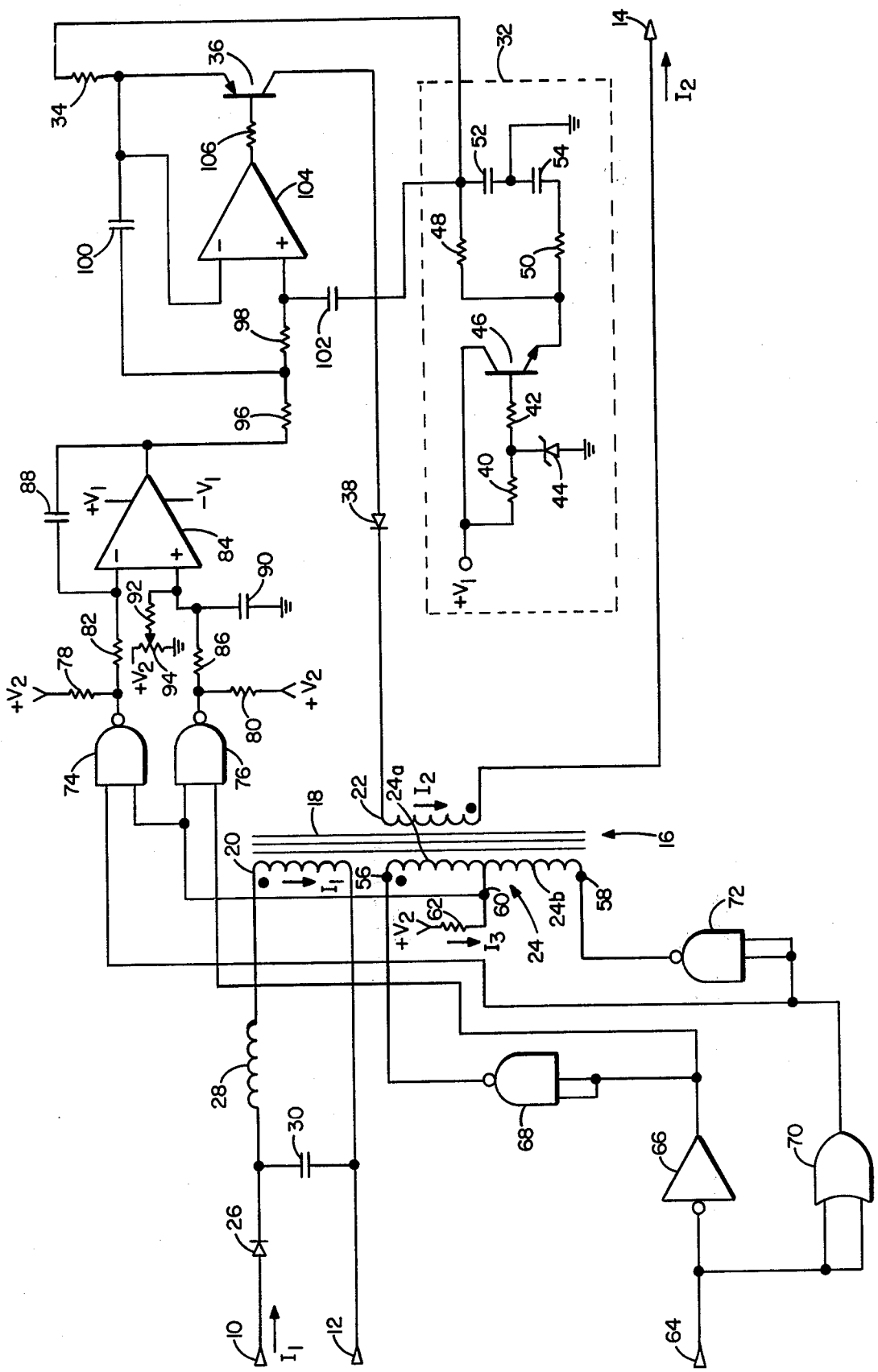

CURRENT ISOLATOR

BACKGROUND OF THE INVENTION

The present invention relates to electrical isolation devices. In particular, the present invention is a device for providing an electrically isolated output current having a known relationship to an input current.

Electrical isolation of signals or circuits is required in a wide variety of applications. For example, in electrical control systems, it is often desirable to electrically isolate the source of an input signal from the electrical circuitry which processes the input signal. Electrical isolation may be required due to differences in operating voltages between the source of the input signal and the signal processing circuitry, for noise considerations, or for a wide variety of other considerations.

It is important that the isolation circuitry not introduce errors. This can be a significant problem, however, when isolation of analog signals is required. Many analog isolation circuits introduce errors due to the temperature sensitivity or drift of the components providing the isolation.

SUMMARY OF THE INVENTION

The present invention is a current isolator which provides an isolated output current having a predetermined relationship to an input current. The current isolator of the present invention includes a magnetically saturable transformer having first, second, and third windings. The input current flows through the first winding, and the output current flows through the second winding. The third winding receives a periodic drive signal which alternately drives the third winding in opposite directions to cause the transformer to be driven between first and second opposite magnetically saturated states.

When a change in input current occurs, it results in changes in the magnetizing current in the third winding. The changes in magnetizing current result in a difference between the time required for the transformer to be driven to the first magnetically saturated state and the time required for the transformer to be driven to the second magnetically saturated state. This difference in saturation times is detected and converted to a control signal which is used to control the output current flowing through the second winding. The output current is changed until it again attains its predetermined relationship with the input current. The change in output current has an opposite effect upon the magnetizing current in the third winding, and therefore tends to reestablish balance between the saturation times as the output current attains the predetermined relationship with the input current.

The current isolator of the present invention preferably uses a magnetically saturable transformer with a core having a square B-H characteristic. The third winding is preferably a center tap winding, and the magnetizing current in the third winding is provided to the center tap. When a change in input current occurs, the magnetizing current in the third winding has a different magnitude during opposite half-cycles of the periodic drive signal. This results in the voltage impressed across the third transformer winding being different during opposite half-cycles of the periodic drive signal. Since the volt-second product is constant, the difference in voltages results in different saturation times.

The difference in saturation times is preferably sensed by digital electronic devices which compare the periodic drive signal and the voltage impressed across one leg of the third winding. The signals resulting from this comparison are filtered and converted to an analog control signal. Current control means connected to the second winding is controlled as a function of the analog control signal.

BRIEF DESCRIPTION OF THE DRAWINGS

The FIGURE is an electrical schematic diagram showing a preferred embodiment of the current isolator of the present invention.

DETAILED DESCRIPTION OF THE PREFERRED EMBODIMENTS

A preferred embodiment of the current isolator of the present invention, as shown in the FIGURE, has first and second input terminals 10 and 12, which are connected to a source (not shown) of input current $I_1$. This source of input current may be, for example, a transducer which senses a parameter and varies current $I_1$ as a function of that parameter.

Output terminal 14 supplies an output current $I_2$ which is electrically isolated from input current $I_1$, but which has a predetermined relationship to current $I_1$. Output current $I_2$ is preferably equal to or proportional to input current $I_1$. In one preferred embodiment, output terminal 14 is connected through a multiplexer (not shown) to an analog-to-digital converter (not shown) which forms part of a signal processing circuit.

The current isolator circuit of the present invention provides electrical isolation of currents $I_1$ and $I_2$ by means of transformer 16. In the preferred embodiment shown in the FIGURE, transformer 16 has a magnetically saturable core 18, which preferably has a square B-H characteristic. In one preferred embodiment, core 18 is a Permalloy 80 tape wound transformer core. Transformer 16 has three windings: first winding 20, second winding 22, and third winding 24.

First winding 20 is connected to terminals 10 and 12, and input current $I_1$ flows through first winding 20. As shown in the FIGURE, a protection and filtering circuit formed by diode 26, inductor 28, and capacitor 30 are also connected between terminals 10 and 12 and first transformer 20. Diode 26 ensures that input current flows in one direction only, while inductor 28 and capacitor 30 form an LC filter. Inductor 28 is chosen so that the reflected load does not appreciably change the magnetizing current $I_3$ in third winding 24. Capacitor 30 helps to prevent the source (not shown) of input current $I_1$ from being affected by transformer switching voltages.

Second transformer winding 22 is connected in a current conduction path which includes power supply 32, resistor 34, and emitter-collector current path of PNP transistor 36, diode 38, and output terminal 14. As shown in the FIGURE, output current $I_2$ flows from power supply 32, through resistor 34, through the emitter-collector current path of current control transistor 36, through anode-to-cathode of diode 38, through second transformer winding 22, and to output terminal 14.

Diode 38, which is connected in the current path through which output current $I_2$ flows, prevents the output current loop from latching up due to large transients. It is believed that this latching is due to the existence of a secondary B-H loop exhibited by the core 18 of transformer 16 when driven into hard saturation. Without diode 38, it is believed that core 18 can enter this secondary B-H loop during a large transient and remain in the secondary B-H loop after the transient has passed. As a result, the characteristics of transformer 16 would be adversely affected.

Power supply 32 must be very stable, so that errors in output current $I_2$ are not introduced due to power supply fluctuations. The FIGURE shows one preferred embodiment of power supply 32, which includes resistors 40 and 42, Zener diode 44, buffer transistor 46, and a filter formed by resistors 48 and 50 and capacitors 52 and 54. It should be understood, however, that other stable power supply circuits may be used in conjunction with the current isolator of the present invention.

Third winding 24 is preferably a center tap winding having first terminal 56, second terminal 58, and center tap terminal 60. First leg 24a of winding 24 is connected between first terminal 56 and center tap terminal 60, while second leg 24b is connected between second terminal 58 and center tap terminal 60. Magnetizing current $I_3$ is supplied to third winding 24 through resistor 62, which is connected between a source of positive voltage and center tap terminal 60.

Third winding 24 is driven by a periodic square wave drive signal which is supplied to the current isolator circuit at terminal 64. In one preferred embodiment, the square wave signal has a frequency of 3.9 kHz.

The square wave drive signal is supplied from drive terminal 64 through inverter 66 and NAND gate 68 to first terminal 56 of third winding 24. NAND gate 68 has both inputs tied together, so that it acts as a second inverter. As a result, the polarity of the drive signal at first terminal 56 is the same as the polarity of the drive signal at drive input terminal 64.

The drive signal is also supplied from drive input terminal 64 through OR gate 70 and NAND gate 72 to second terminal 58 of third winding 24. OR gate 70 has both of its inputs tied together, and merely acts as a buffer. NAND gate 72 has both of its inputs tied together, and acts as an inverter of the signal received from the output of OR gate 70. As a result, the drive signal supplied to second terminal 58 is inverted with respect to the drive signal at input drive terminal 64 and at first terminal 56. Since the magnetizing current $I_3$ flows thru the same resistor 62 on both sides of the B-H curve, the effects of the variation of resistor 62 are effectively cancelled.

In the preferred embodiment shown in the FIGURE, NAND gates 68 and 72 have open collector outputs. As a result, the magnitude of the voltage applied between terminals 56 and 58 can vary when NAND gates 68 or 72 are in their high output states. When the output of NAND gate 68 is high (and the output of NAND gate 72 is low, i.e. zero), the voltage from terminal 58 to terminal 56 is twice the voltage appearing across leg 24b of winding 24. In other words, the voltage at center tap terminal 60 determines the voltage appearing between terminals 58 and 56. Similarly, when the output of NAND gate 72 is high and the output of NAND gate 68 is low, the voltage from terminal 56 to terminal 58 is twice the voltage appearing across leg 24a. Once again, the total voltage across winding 24 is determined by the voltage at center tap terminal 60.

The operation of current isolator of the present invention is dependent upon the transformer characteristic that the volt-second product required to drive the transformer from one magnetically saturated state to the other is constant. Thus, if the voltage across third winding 24 is increased, the saturation time is decreased. Conversely, as the voltage across third winding 24 is decreased, the saturation time is increased.

In the normal steady state condition, input current $I_1$ and output current $I_2$ have a predetermined relationship. Because of the orientation of windings 20 and 22, input current $I_1$ and output current $I_2$ have opposite effects upon magnetizing current $I_3$, which is supplied through resistor 62 to center tap terminal 60. During the steady state condition, the magnetizing current during both half-cycles of the drive signal is the same. As a result, the voltage at center tap terminal 60 is the same during both half-cycles of the drive signal, and the voltage applied across winding 24 is the same for both half-cycles. Since the volt-second product is a constant, the saturation times for both half-cycles of the drive signal are equal.

When input current $I_1$ changes, output current $I_2$ is initially unchanged. This results in a change in magnetizing current $I_3$, so that magnetizing current $I_3$ is no longer equal during opposite half-cycles of the drive signal. As a result, the voltage at center tap terminal 60 is not the same during opposite half-cycles, and the total voltage across winding 24 differs during opposite half-cycles. As a result, the saturation times during opposite half-cycles are no longer equal.

In the present invention, the changes in saturation times are sensed and are converted to an analog control signal which is supplied to the base of PNP current control transistor 36. This causes output current $I_2$ to change to again attain the predetermined relationship with input current $I_1$. Since a change in output current $I_2$ has an opposite effect upon magnetizing current $I_3$, the changes in output current $I_2$ caused by current control transistor 36 tend to return magnetizing current $I_3$ and therefore the saturation times to a balanced condition as output current $I_2$ approaches its predetermined relationship with input current $I_1$.

The sensing of changes in saturation times is provided by NAND gates 74 and 76. NAND gate 74 has one input terminal connected to the output of OR gate 70, and its other input connected to center tap terminal 60. Second NAND gate 76 also has one input connected to center tap terminal 60, and its other input is connected to the output of inverter 66. As a result, the NAND gates 74 and 76 compare the square wave drive signal with the voltage at center tap terminal 60. Prior to saturation, the voltage at center tap terminal 60 is high. Upon saturation, the voltage at center tap terminal 60 goes low (i.e. to zero).

In the preferred embodiment shown in the FIGURE, NAND gates 74 and 76 are open collector output devices, and resistors 78 and 80 are connected to a positive supply voltage $V_2$ to provide output loading of the outputs of NAND gates 74 and 76. The output of NAND gate 74 is connected through resistor 82 to the inverting input of first operational amplifier 84, and the output of NAND gate 76 is connected through resistor 86 to the non-inverting input of first operational amplifier 84. Capacitor 88 is connected between the output of first operational amplifier 84 and the inverting input, while capacitor 90 is connected between the non-inverting input and ground. Resistor 86 and capacitor 90 provide initial filtering, while resistor 82 and capacitor 88 determine the frequency of response characteristic of the circuit together with the transformer turns ratio, the value of resistor 62, the value of resistor 34.

Also shown in the FIGURE is an optional calibration adjustment provided by resistor 92 and potentiometer 94. This calibration circuit may be used to compensate for offset errors due to slight mismatch in the characteristics of the components of the sensing circuitry. Alternatively, the offset error may be compensated for in the signal processing circuitry (not shown) which is connected to output terminal 14 to receive and process output current $I_2$.

Connected to the output of first operational amplifier 84 is a two-pole (Butterworth) filter formed by resistors 96 and 98, and capacitors 100 and 102. Resistors 96 and 98 are connected in series between the output of first operational amplifier 84 and the non-inverting input of second operational amplifier 104. Capacitor 100 is connected between the junction of resistors 96 and 98 and the inverting input of second operational amplifier 104. In addition, the inverting input of second operational amplifier 104 is connected to the emitter of current control transistor 36. Capacitor 102 is connected between the non-inverting input of second operational amplifier 104 and power supply 32.

The output of second operational amplifier 104 is connected through resistor 106 to the base of transistor 36. The output of second operational amplifier 104, therefore, controls the conduction of current control transistor 36, and thereby controls output current $I_2$.

In order to illustrate the operation of the current isolator of the present invention, two examples will be discussed. In the first example, the current isolator circuit will initially be in a balanced or steady state condition, and input current $I_1$ will then increase.

During the first half cycle, in which the input drive signal at drive input terminal 64 is low, the voltage at first terminal 56 is essentially zero. The voltage at second terminal 58 is high because the output of NAND gate 72 is high. As discussed previously, both NAND gate 68 and NAND gate 72 have open collector outputs, and therefore the voltage at second terminal 58 is determined by the voltage between terminal 56 and center tap terminal 60. Because legs 24a and 24b have equal number of turns, the voltage from first terminal 56 to second terminal 58 during the first half-cycle is twice the voltage across leg 24a (i.e. from first terminal 56 to center tap terminal 60).

The increase in input current $I_1$ through first winding 20 causes an increase in magnetizing current flowing through resistor 62 to center tap terminal 60 during the first half-cycle, when second terminal 58 is positive with respect to first terminal 56. This causes a decrease in the voltage at center tap terminal 60, and therefore a decrease in the voltage across winding 24 from first terminal 56 to second terminal 58. Since the volt-second product of the transformer is constant, the time required to saturate the transformer during the first half-cycle is increased due to the decrease in voltage.

During the first half-cycle, the input to NAND gate 76, which is connected to the output of inverter 66 is high, as is the other input to NAND gate 76, which is connected to center tap terminal 60. As a result, the output of NAND gate 76 goes low at the beginning of the first half-cycle when the input drive signal goes low. It remains low until the transformer saturates and the voltage at center tap terminal 60 goes to zero. Because the saturation time is increased, the duration of the output of NAND gate 76 remaining low is increased.

During the first half-cycle, the output of NAND gate 74 remains high, since the input to NAND gate 74 derived from the output of OR gate 70 is low throughout the entire half-cycle.

During the second half-cycle in which the drive signal is high, first terminal 56 is positive with respect to second terminal 58. Because the output of NAND gate 72 is now low, second terminal 58 is essentially at ground or zero volts.

During this second half-cycle, magnetizing current $I_3$ is decreased due to the increase in input current $I_1$. As a result, the voltage at center tap terminal 60 is increased with respect to second terminal 58. Since the output of NAND gate 68 is an open collector and is high during the second half-cycle, the voltage between first terminal 56 and second terminal 58 is twice the voltage across leg 24b (i.e. between center tap terminal 60 and second terminal 58).

The increase in voltage across winding 24 during the second half-cycle causes the transformer to saturate in less time than in the first half-cycle, since the voltage is higher and the volt-second product is constant. The reduction in saturation time during the second half-cycle is sensed by NAND gate 74. During the second half-cycle the input to NAND gate 74 which is derived from the output of OR gate 70 is high throughout the half-cycle, and the input derived from center tap terminal 60 is high from the beginning of the second half-cycle until saturation occurs. Since the saturation time is reduced during the second half-cycle, the low output of NAND gate 74 is reduced in duration. The output of NAND gate 76 during the second half-cycle, of course, remains high since the input derived from inverter 66 is low throughout the second half-cycle.

The outputs of NAND gates 74 and 76 are integrated and supplied to the inverting and non-inverting inputs of first operational amplifier 84, respectively. Since the duration of a low output from NAND gate 74 is decreased, the voltage at inverting input of first operational amplifier 84 tends to rise. Conversely, the increase in duration of a low output from NAND gate 76 causes the voltage at the non-inverting input of first operational amplifier 84 to decrease. The combined effect is to cause the output of first operational amplifier 84 to decrease.

The decrease in the output of first operational amplifier 84 causes a decrease in the voltage at the non-inverting input of second operational amplifier 104. This in turn causes a reduction in the voltage at the output of second operational amplifier 104, thereby reducing the potential of the base electrode of current control transistor 36 and increasing the voltage between base and emitter of transistor 36. As a result, current control transistor 36 turns on harder and greater current flows from power supply 32 through resistor 34, emitter-collector of transistor 36, diode 38, and second winding 22 to output terminal 14.

Due to the opposite orientations of first and second windings 20 and 22, an increase in output current $I_2$ has an opposite effect on magnetizing current $I_3$. In other words, an increase in $I_2$ tends to increase voltage and decrease saturation time during the first half cycle, and tends to decrease voltage and increase saturation time during the second half cycle.

With successive cycles, current $I_2$ continues to increase until the effects of currents $I_1$ and $I_2$ on third winding 24 are again balanced. Due to the feedback provided by output current $I_2$, the current isolator always seeks the balanced condition in which currents $I_1$ and $I_2$ have a predetermined relationship.

In the second example, input current $I_1$ decreases. During the first half-cycle of the drive signal (in which the drive signal is low and second terminal 58 is positive with respect to first terminal 56), magnetizing current $I_3$ decreases. This causes an increase in the potential at center tap terminal 60, and an increase in the voltage across third winding 24. The increased voltage reduces the saturation time during the first half-cycle, and thereby reduces the time duration that NAND gate 76 is low.

During the second half-cycle, current $I_3$ increases and the potential at center tap terminal 60 decreases. The voltage across winding 24, therefore, decreases, and the saturation time increases. This results in a longer low output from NAND gate 74.

The combined effect of the reduction in low output duration from NAND gate 76 and the increase in low output duration from NAND gate 74 is to cause an increase in the voltage at the non-inverting input and a decrease in the voltage at the inverting input of first operational amplifier 84. The output of first operational amplifier 84 increases, thereby causing a voltage increase at the non-inverting input of second operational amplifier 104. This in turn causes an increase in the output voltage of second operational amplifier 104 and a reduction in the base-emitter voltage of current control transistor 36. Output current $I_2$ is, therefore, reduced.

As in the previous example, a change in output current $I_2$ tends to return the circuit to a balanced state. The decrease in output current $I_2$ caused by a change in the control voltage applied to the base of current control transistor 36 has an opposite effect upon magnetizing current $I_3$ as does the decrease in input current $I_1$. As a result, the change in output current $I_2$ again tends to bring the circuit back to a balanced state.

In one preferred embodiment of the present invention, the turns ratio of first winding 20 and second winding 22, the gains of amplifiers 84 and 104, and current control transistor 36 and the value of resistor 34 are selected so that output current $I_2$ is essentially equal to input current $I_1$ (i.e. the current gain of the isolator circuit is unity). It can be seen, however, that a current gain of other than unity, so that $I_2$ is proportional to but not equal to $I_1$, can also be achieved by a proper selection of the turns ratio, the individual transfer gains of the amplifier stages and the value of resistor 34.

The time constant for the circuit is determined by the circuit loop gain. In the preferred embodiments, the time constant is chosen such that there is no overshoot in transient response.

The accuracy of the current isolator circuit is primarily dictated by the matching of NAND gates 68 and 72, NAND gates 74 and 76, and the offset of the integrator formed by resistors 82 and 86, capacitors 88 and 90, and operational amplifier 84. These errors contribute to a constant offset error for a particular set of components which remains essentially constant. As a result, it may be compensated for in the signal processing circuitry (not shown) which receives output current $I_2$, or may be compensated for by potentiometer 94.

In one preferred embodiment, offset errors and temperature variations are minimized by use of Motorola 75452 gates as NAND gates 68, 72, 74 and 76. These gates exhibit a very low $V_{low}$ output and low temperature variation of $V_{low}$.

TABLE 1 is a list of components used in one successful embodiment of the current isolator circuit of the present invention. In this embodiment, optional resistor 92 and potentiometer 94 were not used.

TABLE 1

| | | |
|---|---|---|
| Resistor | 36 | 150 Ohm |
| | 40 | 1K Ohm |
| | 42 | 500 Ohm |
| | 48 | 10 Ohm |
| | 50 | 10 Ohm |
| | 62 | 1K Ohm |
| | 78 | 1K Ohm |
| | 80 | 1K Ohm |
| | 82 | 1M Ohm |
| | 86 | 1M Ohm |
| | 96 | 300K Ohm |
| | 98 | 160K Ohm |
| | 106 | 5,1K Ohm |
| Capacitor | 30 | 22 $\mu f$ |
| | 52 | 0.01 $\mu f$ |
| | 54 | 0.01 $\mu f$ |
| | 88 | 0.01 $\mu f$ |
| | 90 | 0.01 $\mu f$ |
| | 100 | 0.22 $\mu f$ |
| | 102 | 0.10 $\mu f$ |
| Inductor | 28 | 20 mh |
| Transistor | 36 | 2N2907 |
| | 46 | 2N2219 |
| Diode | 26 | 1N4148 |
| | 38 | 1N4148 |
| Zener Diode | 44 | 1N4738 |
| Operational Amplifiers | 84, 104 | TL082P |
| NAND Gates | 68, 72, 74, 76 | 75452 Motorola |
| Inverter | 66 | LS04 |
| OR Gate | 70 | LS32 |
| Transformer | 16 | 05000-0127 B & H Electronics Inc. All leads to transformer 16 short to reduce circuit noise susceptibility. |
| Core | 18 | Permalloy 80 tape wound core |
| First Winding | 20 | Twenty-four turns |
| Second Winding | 22 | Twenty-four turns |
| Third Winding | 24 | Two hundred forty-six turns |

The current isolator of the present invention has several important advantages. First, it provides transformer isolation between input current $I_1$ and output current $I_2$.

Second, the current isolator circuit is relatively temperature insensitive because the transformer 16 is generally temperature insensitive. In addition, since the switching used to sense changes in saturation times is primarily digital and most temperature errors come from analog components, temperature errors are reduced.

Third, because the saturation time sensing components are digital, switching times remain relatively constant. Offset errors due to slight differences in switching times of the logic gates are repeatable and thus may be compensated either in the current isolator circuit itself or in the signal processing circuitry which receives and processes output current $I_2$.

Fourth, no gain correction is required since the input to output conversion is basically a balancing process in which the effects of input current $I_1$ and output current $I_2$ upon magnetizing current $I_3$ in winding 24 are balanced.

Fifth, an isolated power supply like power supply 32 is required only on the output side of the circuit.

In conclusion, although the present invention has been described with reference to preferred embodiments, workers skilled in the art will recognize that changes may be made in form and detail without departing from the spirit and scope of the invention.

What is claimed is:

1. A current isolator for electrically isolating a first current and a second current having a predetermined relationship, the current isolator comprising:
   a transformer having a core and first, second, and third windings, the first winding having the first current flowing therethrough, the second winding having the second current flowing therethrough, and the third winding being connected to receive a periodic drive signal; wherein the periodic drive signal alternately drives the transformer between first and second opposite magnetically saturated states; and wherein changes in magnetizing current in the third winding cause differences between a first saturation time required to drive the transformer from the first to the second magnetically saturated state and a second saturation time required to drive the transformer from the second to the first magnetically saturated state;
   means for providing a control signal as a function of changes in magnetizing current in the third winding resulting from changes in the first and second currents; wherein the means for providing a control signal senses differences between the first and second saturation times and provides the control signal as a function of the sensed differences; the means for providing a control signal comprising:
      first and second integrating means for providing first and second integrated signals representative of the first and second saturation times, respectively; and
      comparing means for comparing the first and second integrated signals and providing the control signal as a function of the comparison; and
   means for controlling the second current as a function of the control signal.

2. The current isolator of claim 1 wherein the third winding has first and second end terminals and the center tap terminal, and wherein the magnetizing current is supplied to the center tap terminal.

3. The current isolator of claim 2 wherein the periodic drive signal is provided to the first and second end terminals of the third winding, and wherein the voltage across the third winding is a function of the magnetizing current supplied to the center tap terminal.

4. The current isolator of claim 3 wherein the first and second windings are oriented so that changes in the first and second currents have opposite effect upon the magnetizing current in the third winding.

5. The current isolator of claim 4 wherein the means for providing a control signal further comprises:
   means for comparing the periodic drive signal and a signal derived from the center tap terminal, and supplying signals to the first and second integrating means as a function of the comparing.

6. The current isolator of claim 5 wherein the core has a square B-H characteristic.

7. A current isolator for receiving a first current and providing a second current which is electrically isolated from the first current and has a predetermined relationship to the first current, the current isolator comprising:
   a transformer having a core and first, second, and third windings, the first winding having the first current flowing therethrough, and the second winding having the second current flowing therethrough;
   drive means connected to the third winding for alternately driving the transformer between the first and second opposite magnetically saturated states;
   means for providing a control signal as a function of differences between a first saturation time required to drive the transformer from the first to the second magnetically saturated state and a second saturation time required to drive the transformer from the second to the first magnetically saturated state, and wherein differences between the first and second saturation times are a function of the first and second currents; and wherein the means for providing a control signal comprises:
      first and second integrating means for providing first and second integrated signals representative of the first and second saturation times, respectively; and
      comparing means for comparing the first and second integrated signals and providing the control signal as a function of the comparison; and
   means for controlling the second current as a function of the control signal.

8. The current isolator of claim 7 wherein the first and second windings are oriented so that changes in the first and second currents have opposite effects upon the first and second saturation times.

9. The current isolator of claim 7 wherein the third winding has first and second end terminals and the center tap terminal, and wherein the drive means is connected to the first and second end terminals.

10. The current isolator of claim 9 and further comprising:
    means connected to the center tap terminal for providing magnetizing current.

11. The current isolator of claim 10 wherein the voltage across the third winding is a function of the magnetizing current.

* * * * *